(12) United States Patent
Rwei et al.

(10) Patent No.: US 12,207,401 B2
(45) Date of Patent: Jan. 21, 2025

(54) EMBEDDED SMART MODULE

(71) Applicant: National Taipei University of Technology, Taipei (TW)

(72) Inventors: Syang-Peng Rwei, Taipei (TW); Yuan-Fu Cheng, Taipei (TW); Lih Jen Kau, Taipei (TW)

(73) Assignee: National Taipei University of Technology, Taipei (TW)

( * ) Notice: Subject to any disclaimer, the term of this patent is extended or adjusted under 35 U.S.C. 154(b) by 360 days.

(21) Appl. No.: 17/963,188

(22) Filed: Oct. 10, 2022

(65) Prior Publication Data

US 2024/0098893 A1 Mar. 21, 2024

(30) Foreign Application Priority Data

Sep. 16, 2022 (TW) .................................. 111135243

(51) Int. Cl.
*H05K 1/02* (2006.01)
*H05K 1/03* (2006.01)
*H05K 1/05* (2006.01)

(52) U.S. Cl.
CPC ........... *H05K 1/0393* (2013.01); *H05K 1/028* (2013.01); *H05K 1/038* (2013.01); *H05K 1/05* (2013.01)

(58) Field of Classification Search
CPC ......... H05K 1/028; H05K 1/0393; H05K 1/05
See application file for complete search history.

(56) References Cited

U.S. PATENT DOCUMENTS

| | | | |
|---|---|---|---|
| 7,980,863 B1 | 7/2011 | Holec et al. | |
| 9,820,692 B2 * | 11/2017 | Wang | A61B 5/6833 |
| 10,722,160 B2 * | 7/2020 | Wang | A61B 5/14532 |
| 2014/0124257 A1 * | 5/2014 | Yoshihara | H05K 1/02 174/254 |
| 2015/0148641 A1 * | 5/2015 | Morun | H05K 1/167 600/372 |
| 2015/0377466 A1 | 12/2015 | Gershowitz et al. | |
| 2016/0037625 A1 * | 2/2016 | Huitema | G09F 21/02 361/749 |

(Continued)

FOREIGN PATENT DOCUMENTS

| | | |
|---|---|---|
| TW | 201138743 | 11/2011 |
| TW | I682532 | 1/2020 |
| TW | 202040126 | 11/2020 |

OTHER PUBLICATIONS

"Office Action of Taiwan Counterpart Application", issued on May 12, 2023, p. 1-p. 6.

*Primary Examiner* — Hoa C Nguyen

(74) *Attorney, Agent, or Firm* — JCIPRNET

(57) ABSTRACT

An embedded smart module including a twistable substrate, an electrode layer, a circuit layer, an insulating layer, an electronic component and a sensing component is provided. The electrode layer is disposed on the twistable substrate. The circuit layer is disposed in the electrode layer and exposed at the surface of the electrode layer. The insulating layer is disposed between the electrode layer and the circuit layer. The electronic component is disposed on the electrode layer and the circuit layer and electrically connected with the electrode layer and the circuit layer. The sensing component is disposed on the electrode layer and the circuit layer and electrically connected with the electrode layer and the circuit layer.

10 Claims, 4 Drawing Sheets

(56) References Cited

U.S. PATENT DOCUMENTS

| | | | |
|---|---|---|---|
| 2018/0020977 A1* | 1/2018 | Li | A61B 5/308 |
| | | | 600/384 |
| 2018/0231414 A1* | 8/2018 | Tsukagoshi | G01J 1/0209 |
| 2018/0317833 A1* | 11/2018 | Heikenfeld | G01N 33/5438 |
| 2020/0249197 A1* | 8/2020 | Chou | A61B 5/297 |
| 2020/0330007 A1 | 10/2020 | Garai et al. | |
| 2020/0337641 A1* | 10/2020 | Wang | A61B 5/1486 |
| 2021/0204878 A1 | 7/2021 | Huang | |
| 2023/0048524 A1* | 2/2023 | Amano | G01P 15/14 |

\* cited by examiner

EMBEDDED SMART MODULE

CROSS-REFERENCE TO RELATED APPLICATION

This application claims the priority benefit of Taiwan application serial no. 111135243, filed on Sep. 16, 2022. The entirety of the above-mentioned patent application is hereby incorporated by reference herein and made a part of this specification.

BACKGROUND

Technical Field

The present invention relates to an electronic device module, and particularly to an embedded smart module.

DESCRIPTION OF RELATED ART

In recent years, the technology related to smart fabrics has been adopted as solutions by garment manufacturers and clothing designers to solve their technical problems in industry, essentials services, leisure, and medical care, and therefore such technology conforms to the trend of wearable electronic apparatuses.

For a conventional wearable electronic apparatus, a plurality of electronic devices are disposed on a substrate and electrically connected to a circuit layer that drives these electronic devices. In order to drive these electronic devices, a plurality of layers are required to be disposed in the electronic apparatus, and conductive vias have to be disposed between these circuit layers. As a result, the circuit design is difficult, and the electronic apparatus is easily to be broken due to bending.

SUMMARY

The present invention provides an embedded smart module, wherein the insulating layer is embedded in the electrode layer, and the circuit layer is embedded in the insulating layer.

An embedded smart module of the present invention includes a twistable substrate, an electrode layer, a circuit layer, an insulating layer, an electronic component and a sensing component is provided. The electrode layer is disposed on the twistable substrate. The circuit layer is disposed in the electrode layer and exposed at the surface of the electrode layer. The insulating layer is disposed between the electrode layer and the circuit layer. The electronic component is disposed on the electrode layer and the circuit layer and electrically connected with the electrode layer and the circuit layer. The sensing component is disposed on the electrode layer and the circuit layer and electrically connected with the electrode layer and the circuit layer.

In an embodiment of the embedded smart module of the present invention, the twistable substrate includes a fabric, a polyurethane substrate, a silicone substrate or a rubber substrate.

In an embodiment of the embedded smart module of the present invention, the electronic component includes a flexible circuit board, an electronic device and a plurality of pins. The flexible circuit board is disposed on the electrode layer and the circuit layer. The electronic device is disposed on the flexible circuit board and electrically connected with the flexible circuit board. The pins are disposed between the flexible circuit board and the electrode layer and between the flexible circuit board and the circuit layer.

In an embodiment of the embedded smart module of the present invention, the electronic device includes a chip having an active device, a passive device or a combination thereof.

In an embodiment of the embedded smart module of the present invention, the chip has a transistor, a memory, a diode, a resistor, a capacitor, an inductor, an oscillator, a microcontroller unit (MCU) or a combination thereof.

In an embodiment of the embedded smart module of the present invention, a thickness of the flexible circuit board is between 35 μm and 180 μm.

In an embodiment of the embedded smart module of the present invention, the sensing component includes a flexible circuit board, a sensing device and a plurality of pins. The flexible circuit board is disposed on the electrode layer and the circuit layer. The sensing device is disposed on the flexible circuit board and electrically connected with the flexible circuit board. The pins are disposed between the flexible circuit board and the electrode layer and between the flexible circuit board and the circuit layer.

In an embodiment of the embedded smart module of the present invention, a thickness of the flexible circuit board is between 35 μm and 180 μm.

In an embodiment of the embedded smart module of the present invention, the embedded smart module further includes a protective layer. The protective layer is disposed on the twistable substrate and at least encapsulates the electrode layer, the circuit layer, the insulating layer and the electronic component.

In an embodiment of the embedded smart module of the present invention, the protective layer further encapsulates the sensing component.

Based on the above, in the embedded smart module of the present invention, the insulating layer is embedded in the electrode layer, and the circuit layer is embedded in the insulating layer. In this way, the layout area of the electrode layer, the insulating layer and the circuit layer may be effectively reduced, and the overall thickness of the embedded smart module may be effectively reduced.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1A:
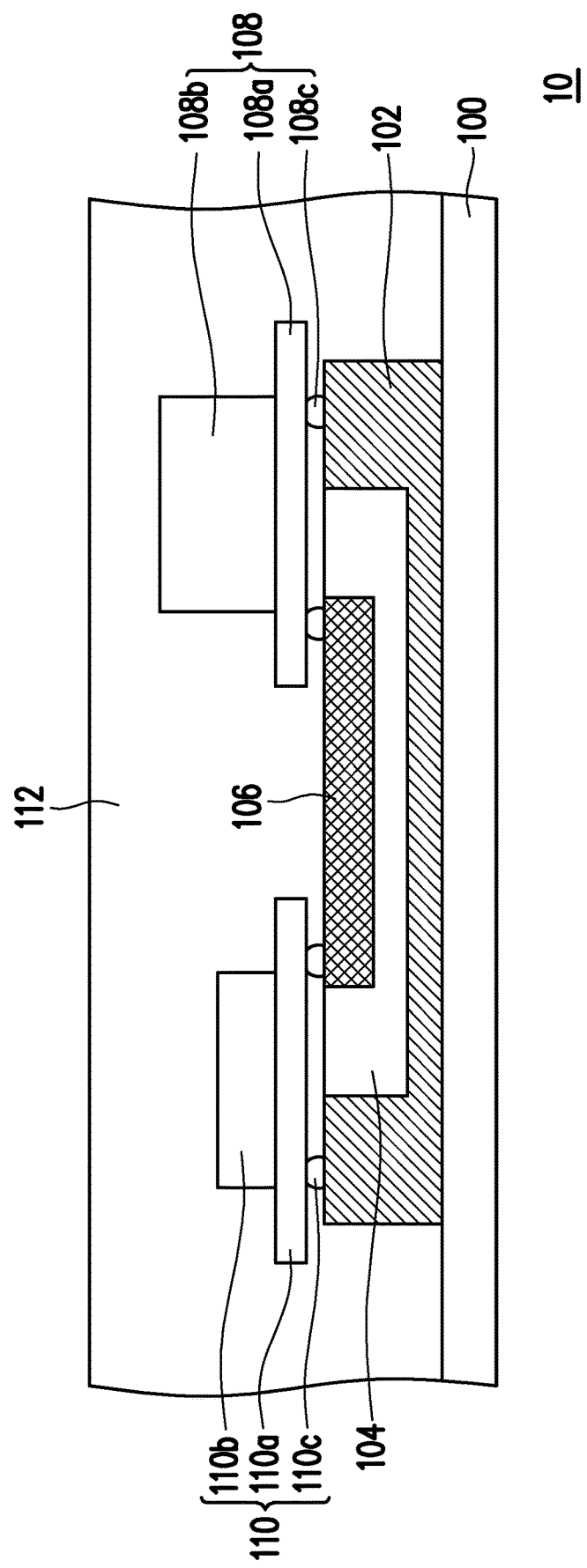
FIG. 1A is a schematic cross-sectional view of an embedded smart module according to the first embodiment of the present invention.

The embodiments are described in detail below with reference to the accompanying drawings, but the embodiments are not intended to limit the scope of the present invention. In addition, the drawings are for illustrative purposes only and are not drawn to the original dimensions. For the sake of easy understanding, the same elements in the following description will be denoted by the same reference numerals.

In the text, the terms mentioned in the text, such as "comprising", "including", "containing" and "having" are all open-ended terms, i.e., meaning "including but not limited to".

When using terms such as "first" and "second" to describe elements, it is only used to distinguish the elements from each other, and does not limit the order or importance of the devices. Therefore, in some cases, the first element may also be called the second element, the second element may also be called the first element, and this is not beyond the scope of the present invention.

In addition, the directional terms, such as "on", "above", "under" and "below" mentioned in the text are only used to refer to the direction of the drawings, and are not used to limit the present invention.

Further, in the text, the range represented by "a value to another value" is a summary expression way to avoid listing all the values in the range one by one in the specification. Therefore, the record of a specific numerical range covers any numerical value within the numerical range, as well as a smaller numerical range defined by any numerical value within the numerical range.

Figure 1B:
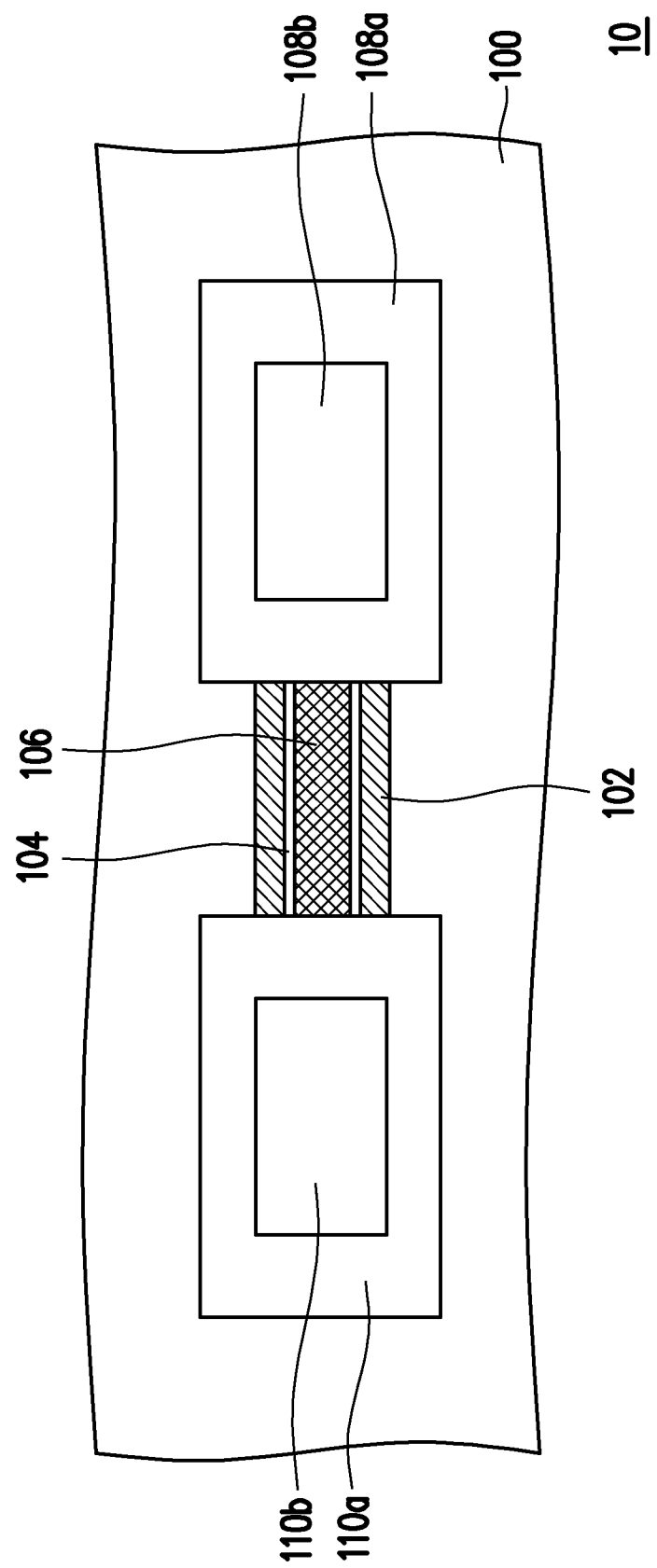
FIG. 1B is a schematic top view of the embedded smart module of FIG. 1A.

FIG. 1A is a schematic cross-sectional view of an embedded smart module according to the first embodiment of the present invention. FIG. 1B is a schematic top view of the embedded smart module of FIG. 1A. For clarity, a protective layer is omitted in FIG. 1B.

Referring to FIGS. 1A and 1B, the embedded smart module 10 of the present embodiment includes a twistable substrate 100, an electrode layer 102, an insulating layer 104, a circuit layer 106, an electronic component 108 and a sensing component 110. In the present embodiment, the electronic component 108 is a component that does not include a sensing component, which will be described later. The twistable substrate 100 has properties such as bendable, twistable and foldable. In the present embodiment, the twistable substrate 100 may be a fabric, a polyurethane substrate, a silicone substrate, a rubber substrate or other suitable substrates. When the embedded smart module 10 is applied to a wearable electronic apparatus, the twistable substrate 100 is preferably a fabric.

The electrode layer 102 is disposed on the twistable substrate 100. In the present embodiment, the electrode layer 102 constitutes a strip electrode, but the present invention is not limited thereto. In other embodiments, the electrode layer 102 may constitute electrodes of other shapes, such as a curved electrode or a finger electrode, depending on actual needs. The material of the electrode layer 102 may be any suitable conductive material, and the electrode layer 102 may be formed on twistable substrate 100 by any suitable method (such as spraying, screen printing, roll-to-roll printing, 3D printing, electroplating, sputtering, etc.).

The insulating layer 104 is disposed in the electrode layer 102 and exposed by the electrode layer 102. In the present embodiment, the insulating layer 104 does not penetrate the electrode layer 102, but the present invention is not limited thereto. In other embodiments, depending on actual needs, the insulating layer 104 may penetrate a part of the electrode layer 102, as long as the electrode layer 102 may be prevented from being penetrated by the insulating layer 104 to form a plurality of parts that are electrically separated from each other. In addition, in the present embodiment, the top surface of the insulating layer 104 is coplanar with the top surface of the electrode layer 102, but the present invention is not limited thereto. In other embodiments, the top surface of the insulating layer 104 may be higher or lower than the top surface of the electrode layer 102 depending on actual needs. The material of the insulating layer 104 may be any suitable insulating material, and the insulating layer 104 may be formed in the pre-formed groove in the electrode layer 102 by any suitable method (such as spraying, screen printing, continuous roll printing, 3D printing, etc.).

The circuit layer 106 is disposed in the insulating layer 104 and exposed by the insulating layer 104. In addition, the circuit layer 106 does not penetrate the insulating layer 104 to avoid a short circuit between the circuit layer 106 and the electrode layer 102. Furthermore, in the present embodiment, the top surface of the circuit layer 106 is coplanar with the top surface of the insulating layer 104, but the present invention is not limited thereto. In other embodiments, the top surface of the circuit layer 106 may be higher or lower than the top surface of the insulating layer 104, depending on actual needs. The material of the circuit layer 106 may be any suitable conductive material, and the circuit layer 106 may be formed in the pre-formed groove in insulating layer 104 by any suitable method (such as spraying, screen printing, continuous roll printing, 3D printing, etc.).

As may be seen from the above, in the present embodiment, the insulating layer 104 is disposed between the electrode layer 102 and the circuit layer 106, so that the insulating layer 104 and the circuit layer 106 are buried in the electrode layer 102, and the circuit layer 106 is buried in the insulating layer 104. In this way, the layout area of the electrode layer 102, the insulating layer 104 and the circuit layer 106 may be effectively reduced, and the overall thickness of the embedded smart module 10 may be effectively reduced, so as to facilitate the miniaturization of the embedded smart module 10.

The electronic component 108 is disposed on the electrode layer 102 and the circuit layer 106, and electrically connected with the electrode layer 102 and the circuit layer 106. In the present embodiment, the electronic component 108 includes a flexible circuit board 108a, an electronic device 108b and pins 108c.

The flexible circuit board 108a is disposed on the electrode layer 102 and the circuit layer 106. The thickness of the flexible circuit board 108a is, for example, between 35 μm and 180 μm. When the thickness of the flexible circuit board 108a is greater than 180 μm, the rigidity of the flexible circuit board 108a is too large to cause a problem that the flexible circuit board 108a cannot be twisted. When the thickness of the flexible circuit board 108a is less than lam, the thickness of the flexible circuit board 108a is too thin to be easily broken when the flexible circuit board 108a is twisted. When the thickness of the flexible circuit board 108a is between 35 μm and 180 μm, the bending angle may be up to 150° or more with good twist. The present invention does not limit the type of flexible circuit board 108a.

The electronic device 108b is disposed on the flexible circuit board 108a, and electrically connected with the flexible circuit board 108a. The electronic device 108b may be electrically connected with the flexible circuit board 108a through conductive glue or other suitable method, which is not limited in the present invention. The electronic device 108b may be a wafer having active devices or passive devices. The active device or passive device is, for example, a transistor, a memory, a diode, a resistor, a capacitor, an inductor, an oscillator, a microcontroller unit or a combination thereof. In addition, the electronic device 108b may include a battery, and the battery may be a rechargeable battery or a disposable battery. In the present embodiment, one electronic device 108b is disposed on the flexible circuit board 108a, but the present invention is not limited thereto. In other embodiments, a plurality of electronic devices 108b may be disposed on the flexible circuit board 108a depending to actual needs.

The pins 108c are disposed between the flexible circuit board 108a and the electrode layer 102 and between the flexible circuit board 108a and the circuit layer 106, so that the flexible circuit board 108a is electrically connected with the electrode layer 102 and the circuit layer 106. In the present embodiment, since the top surface of the electrode layer 102, the top surface of the insulating layer 104 and the top surface of the circuit layer 106 are coplanar, the pin 108c may have the same size, and thus the electronic device 108b may be stably disposed on the electrode layer 102 and the circuit layer 106.

In the present embodiment, the electronic component 108 includes the flexible circuit board 108a, the electronic device 108b and pins 108c, but the present invention is not limited thereto. In other embodiments, the electronic component with other configurations may be disposed on the electrode layer 102 and the circuit layer 106 by any suitable method, and electrically connected with the electrode layer 102 and the circuit layer 106.

The sensing component 110 is disposed on the electrode layer 102 and the circuit layer 106, and electrically connected with the electrode layer 102 and the circuit layer 106. In the present embodiment, the sensing component 110 includes a flexible circuit board 110a, a sensing device 110b and pins 110c.

The flexible circuit board 110a is disposed on the electrode layer 102 and the circuit layer 106. The thickness of the flexible circuit board 110a is, for example, between 35 μm and 180 μm. When the thickness of the flexible circuit board 110a is greater than 180 μm, the rigidity of the flexible circuit board 110a is too large to cause a problem that the flexible circuit board 110a cannot be twisted. When the thickness of the flexible circuit board 110a is less than 1am, the thickness of the flexible circuit board 110a is too thin to be easily broken when the flexible circuit board 110a is twisted. When the thickness of the flexible circuit board 110a is between 35 μm and 180 μm, the bending angle may be up to 150° or more with good twist. The present invention does not limit the type of flexible circuit board 110a.

The sensing device 110b is disposed on the flexible circuit board 110a, and electrically connected with the flexible circuit board 110a. The sensing device 110b may be electrically connected with the flexible circuit board 110a through conductive glue or other suitable method, which is not limited in the present invention. The sensing device 110b is, for example, a physiological signal sensing device, which may be used to monitor an user's physiological signals. In the present embodiment, one sensing device 110b is disposed on the flexible circuit board 110a, but the present invention is not limited thereto. In other embodiments, a plurality of sensing devices 110b may be disposed on the flexible circuit board 110a depending to actual needs.

The pins 110c are disposed between the flexible circuit board 110a and the electrode layer 102 and between the flexible circuit board 110a and the circuit layer 106, so that the flexible circuit board 110a is electrically connected with the electrode layer 102 and the circuit layer 106. In the present embodiment, since the top surface of the electrode layer 102, the top surface of the insulating layer 104 and the top surface of the circuit layer 106 are coplanar, the pins 110c may have the same size, and the sensing device 110b may be stably disposed on the electrode layer 102 and the circuit layer 106.

In the present embodiment, the sensing component 110 includes the flexible circuit board 110a, the sensing devices 110b and pins 110c, but the present invention is not limited thereto. In other embodiments, the sensing component with other configurations may be disposed on the electrode layer 102 and the circuit layer 106 by any suitable method, and electrically connected with the electrode layer 102 and the circuit layer 106.

In addition, the embedded smart module 10 may also include a protective layer 112. The protective layer 112 is disposed on the twistable substrate 100 and encapsulates the electrode layer 102, the insulating layer 104, the circuit layer 106, the electronic component 108 and the sensing component 110. The material of the protective layer 112 is, for example, a material characterized in waterproof, thermal conductivity and moisture impermeability, and may be formed on the twistable substrate 100 by any suitable method (such as dispensing, spraying, screen printing, roll-to-roll printing, 3D printing, etc.). Therefore, when the embedded smart module 10 is applied to a wearable electronic apparatus, the protective layer 112 may effectively prevent various components disposed on the twistable substrate 100 from being damaged by direct contact with the user's skin.

Figure 2:
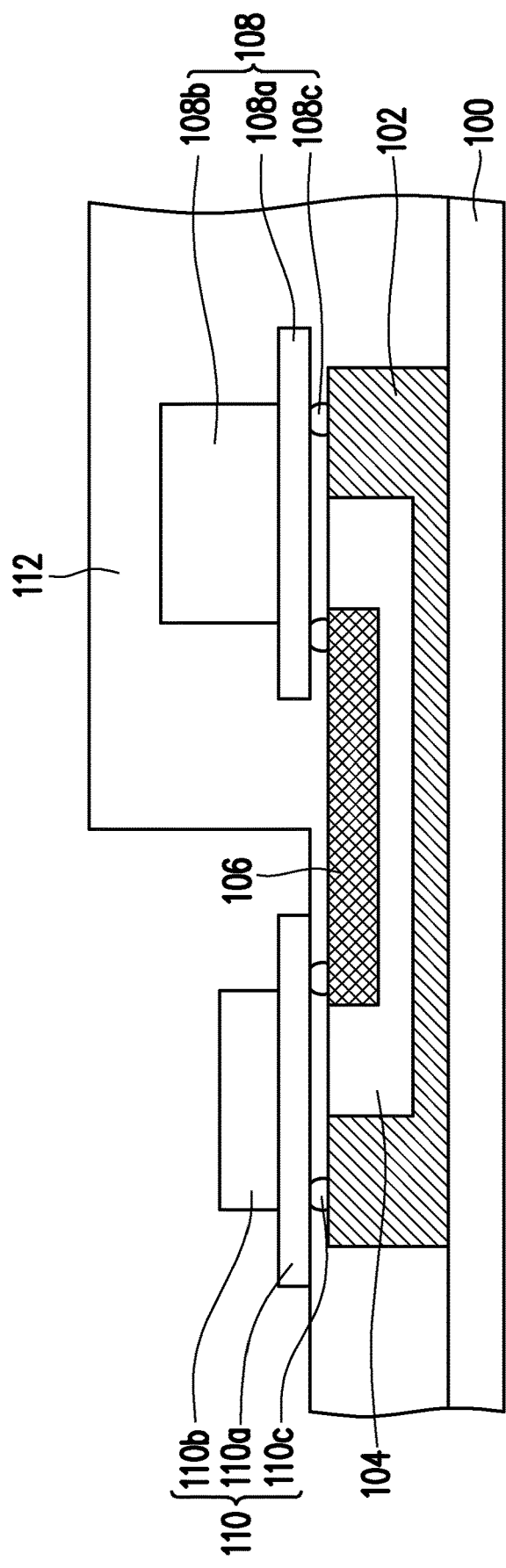
FIG. 2 is a schematic cross-sectional view of an embedded smart module according to the second embodiment of the present invention.

FIG. 2 is a schematic cross-sectional view of an embedded smart module according to the second embodiment of the present invention. In the present embodiment, the same elements used in the first embodiment will be denoted by the same reference symbols, and related description will be omitted.

Referring to FIG. 2, in the present embodiment, the difference between the embedded smart module 20 and the embedded smart module 10 is in that: in the embedded smart module 20, the sensing component 110 itself may have a protective layer (not shown), so the protective layer 112 may encapsulate the electrode layer 102, the insulating layer 104, the circuit layer 106 and the electronic component 108 without encapsulating the entire sensing component 110.

The application of the embedded smart module of the present invention will be described below by taking the embedded smart module 10 as an example. In other embodiment, the embedded smart module 10 may be replaced with the embedded smart module 20 according to the actual needs.

Figure 3:
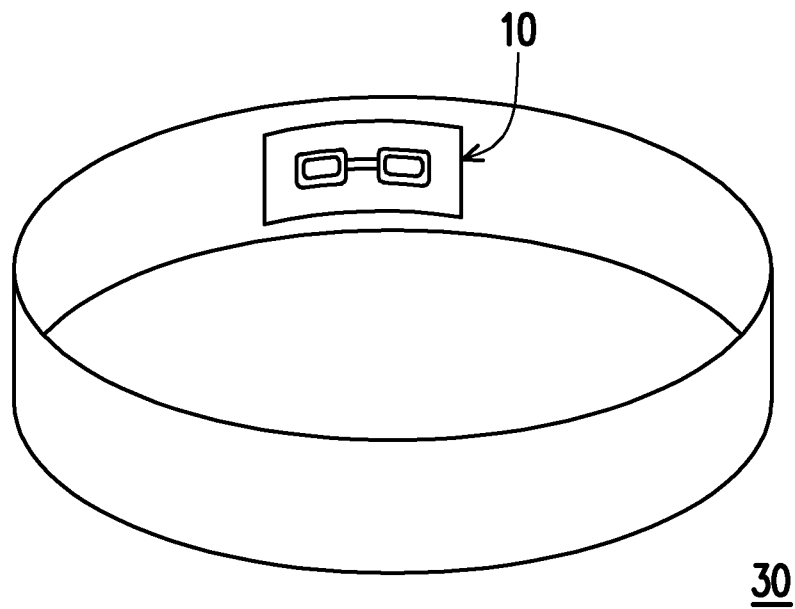
FIG. 3 is a schematic diagram of a wearable apparatus including an embedded smart module of the present invention.

FIG. 3 is a schematic diagram of a wearable apparatus including an embedded smart module of the present invention. In the present embodiment, the wearable apparatus 30 is a smart physiological textile bracelet. The wearable apparatus 30 includes the embedded smart module 10 and an annular body 300. The embedded smart module 10 is disposed on the inner surface of the annular body 300. When the user wears the wearable apparatus 30, the sensing component 110 in the embedded smart module 10 may or may not be in contact with the user's skin depending on the sensing type to monitor the user's physiological state.

Figure 4:
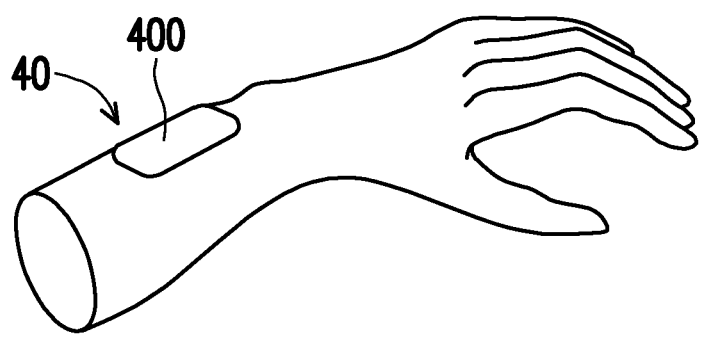
FIG. 4 is a schematic diagram of an attaching apparatus including an embedded smart module of the present invention.

FIG. 4 is a schematic diagram of an attaching apparatus including an embedded smart module of the present invention. In the present embodiment, the attaching apparatus 40 includes the embedded smart module 10 and the adhesion body 400. The embedded smart module 10 is disposed on the adhesion body 400, and the adhesion body 400 is attached to the user's skin in a manner that the embedded smart module 10 faces the user's skin. In this way, the embedded smart module 10 may be in contact with the user's skin to monitor the user's physiological state.

It will be apparent to those skilled in the art that various modifications and variations may be made to the disclosed embodiments without departing from the scope or spirit of the invention. In view of the foregoing, it is intended that the invention covers modifications and variations provided that they fall within the scope of the following claims and their equivalents.

What is claimed is:

1. An embedded smart module, comprising:
   a twistable substrate;
   an electrode layer, disposed on the twistable substrate;
   a circuit layer, disposed in the electrode layer and exposed at the surface of the electrode layer;
   an insulating layer, disposed between the electrode layer and the circuit layer;
   an electronic component, disposed on the electrode layer and the circuit layer and electrically connected with the electrode layer and the circuit layer; and
   a sensing component, disposed on the electrode layer and the circuit layer and electrically connected with the electrode layer and the circuit layer.

2. The embedded smart module of claim 1, wherein the twistable substrate comprises a fabric, a polyurethane substrate, a silicone substrate or a rubber substrate.

3. The embedded smart module of claim 1, wherein the electronic component comprises:
   a flexible circuit board, disposed on the electrode layer and the circuit layer;
   an electronic device, disposed on the flexible circuit board and electrically connected with the flexible circuit board; and
   a plurality of pins, disposed between the flexible circuit board and the electrode layer and between the flexible circuit board and the circuit layer.

4. The embedded smart module of claim 3, wherein the electronic device comprises a chip having an active device, a passive device or a combination thereof.

5. The embedded smart module of claim 4, wherein the chip has a transistor, a memory, a diode, a resistor, a capacitor, an inductor, an oscillator, a microcontroller unit or a combination thereof.

6. The embedded smart module of claim 3, wherein a thickness of the flexible circuit board is between 35 μm and 180 μm.

7. The embedded smart module of claim 1, wherein the sensing component comprises:
   a flexible circuit board, disposed on the electrode layer and the circuit layer;
   a sensing device, disposed on the flexible circuit board and electrically connected with the flexible circuit board; and
   a plurality of pins, disposed between the flexible circuit board and the electrode layer and between the flexible circuit board and the circuit layer.

8. The embedded smart module of claim 7, wherein a thickness of the flexible circuit board is between 35 μm and 180 μm.

9. The embedded smart module of claim 7, further comprising a protective layer, disposed on the twistable substrate and at least encapsulating the electrode layer, the circuit layer, the insulating layer and the electronic component.

10. The embedded smart module of claim 9, wherein the protective layer further encapsulates the sensing component.

* * * * *